(12) United States Patent
Hayasaka et al.

(10) Patent No.: US 11,978,614 B2
(45) Date of Patent: May 7, 2024

(54) SUBSTRATE PROCESSING APPARATUS

(71) Applicant: Tokyo Electron Limited, Tokyo (JP)

(72) Inventors: Yusuke Hayasaka, Miyagi (JP); Jun Young Chung, Hwaseong-si (KR); Shuhei Yamabe, Miyagi (JP); Keiichi Yamaguchi, Miyagi (JP); Takehiro Tanikawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 331 days.

(21) Appl. No.: 16/903,571

(22) Filed: Jun. 17, 2020

(65) Prior Publication Data

US 2020/0402775 A1 Dec. 24, 2020

(30) Foreign Application Priority Data

Jun. 18, 2019 (JP) .................................. 2019-113135
Feb. 21, 2020 (JP) .................................. 2020-028711

(51) Int. Cl.
*H01J 37/32* (2006.01)
(52) U.S. Cl.
CPC .. *H01J 37/32522* (2013.01); *H01J 37/32449* (2013.01); *H01J 37/32477* (2013.01); *H01J 37/32651* (2013.01); *H01J 37/32743* (2013.01); *H01J 2237/334* (2013.01)
(58) Field of Classification Search
None
See application file for complete search history.

(56) References Cited

U.S. PATENT DOCUMENTS

| 6,432,203 | B1 * | 8/2002 | Black ............... | H01L 21/67109 204/298.11 |
|---|---|---|---|---|
| 11,532,461 | B2 * | 12/2022 | Saito ................. | H01J 37/32495 |
| 2002/0076490 | A1 * | 6/2002 | Chiang ............ | H01J 37/32449 257/E21.171 |
| 2002/0185068 | A1 * | 12/2002 | Gurary ............. | H01L 29/66757 118/722 |
| 2004/0149214 | A1 * | 8/2004 | Hirose ............. | H01L 21/67126 118/715 |
| 2008/0000422 | A1 * | 1/2008 | Park ................. | H01L 21/6719 118/712 |
| 2010/0282168 | A1 * | 11/2010 | Kishimoto ....... | H01J 37/32009 118/725 |
| 2017/0292633 | A1 * | 10/2017 | Hill ................... | F16K 1/22 |
| 2019/0103255 | A1 * | 4/2019 | Chung ............. | H01L 21/67253 |
| 2021/0272779 | A1 * | 9/2021 | Hayasaka ........ | H01J 37/32504 |

FOREIGN PATENT DOCUMENTS

| JP | H11-204442 A | 7/1999 |
|---|---|---|
| JP | 2004-023060 A | 1/2004 |
| JP | 2007-227789 A | 9/2007 |
| JP | 2012-138497 A | 7/2012 |
| JP | 2015-126197 A | 7/2015 |
| JP | 2016-081158 A | 5/2016 |
| JP | 2019-041024 A | 3/2019 |
| KR | 10-2016-0075138 A | 6/2016 |

* cited by examiner

*Primary Examiner* — Karla A Moore
(74) *Attorney, Agent, or Firm* — Pearne & Gordon LLP

(57) ABSTRACT

A substrate processing apparatus includes a chamber having a plasma processing space, a sidewall of the chamber having an opening for transferring a substrate into the plasma processing space; and a shutter disposed at an inner side than the sidewall and configured to open or close the opening, the shutter having a flow path for a temperature-controlled fluid.

7 Claims, 9 Drawing Sheets

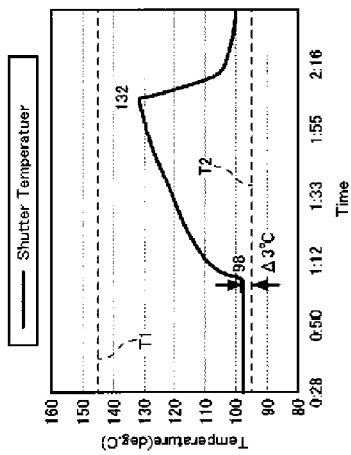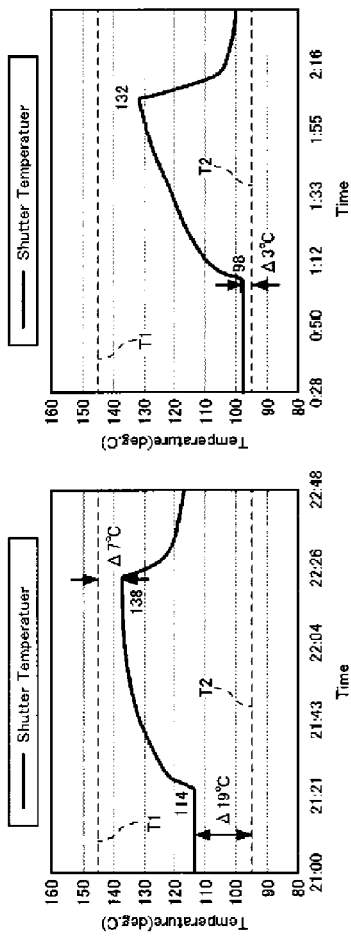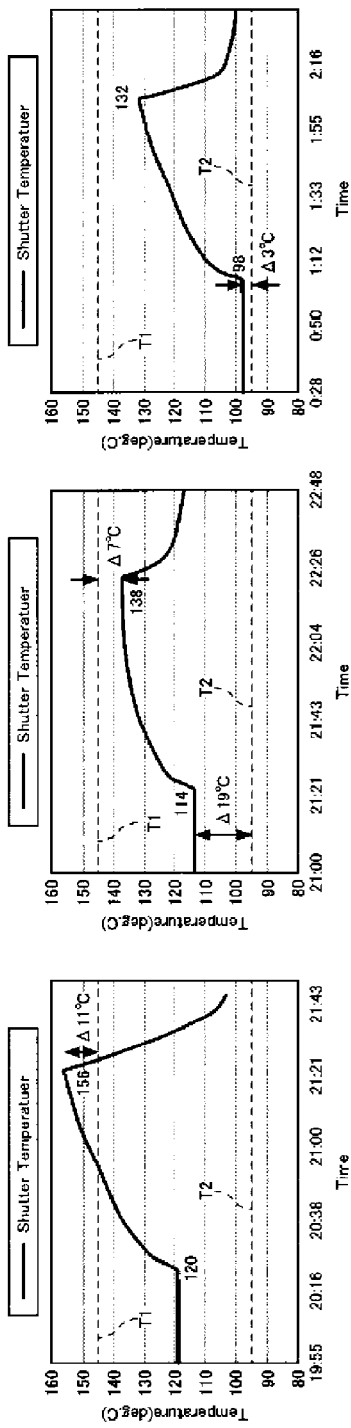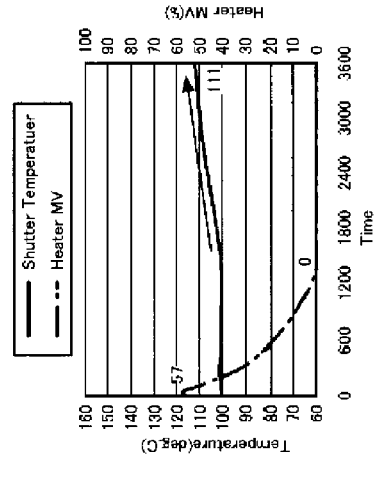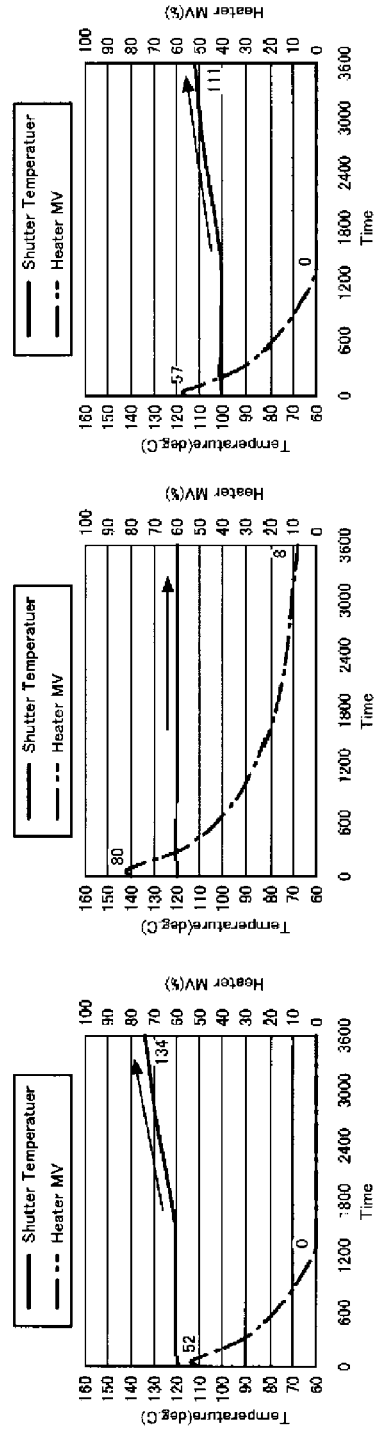

FIG. 9

| | | | FIRST EXAMPLE | | | | | SECOND EXAMPLE | | | | | THIRD EXAMPLE | | | | | FOURTH EXAMPLE | | | | |
|---|---|---|---|---|---|---|---|---|---|---|---|---|---|---|---|---|---|---|---|---|---|---|
| TEMPERATURE [°C] | | | PART | AIR FLOW RATE [L] | | | | PART | AIR FLOW RATE [L] | | | | PART | AIR FLOW RATE [L] | | | | PART | AIR FLOW RATE [L] | | | |
| | | | | 0 | 10 | 20 | 30 | | 0 | 10 | 20 | 30 | | 0 | 10 | 20 | 30 | | 0 | 10 | 20 | 30 |
| | IDLE | | VALVE BODY | 147 | 126 | 111 | 100 | VALVE BODY | 147 | 126 | 112 | 101 | VALVE BODY | 148 | 126 | 111 | 100 | VALVE BODY | 149 | 127 | 112 | 101 |
| | | | FLANGE | 161 | 138 | 121 | 109 | FLANGE | 161 | 138 | 122 | 110 | FLANGE | 161 | 138 | 121 | 108 | FLANGE | 162 | 139 | 122 | 110 |
| | PROCESS | | PART | AIR FLOW RATE [L] | | | | PART | AIR FLOW RATE [L] | | | | PART | AIR FLOW RATE [L] | | | | PART | AIR FLOW RATE [L] | | | |
| | | | | 0 | 10 | 20 | 30 | | 0 | 10 | 20 | 30 | | 0 | 10 | 20 | 30 | | 0 | 10 | 20 | 30 |
| | | | VALVE BODY | 192 | 145 | 119 | 103 | VALVE BODY | 192 | 145 | 119 | 103 | VALVE BODY | 193 | 143 | 116 | 99 | VALVE BODY | 194 | 143 | 116 | 99 |
| | | | FLANGE | 154 | 117 | 95 | 83 | FLANGE | 154 | 117 | 95 | 83 | FLANGE | 154 | 116 | 93 | 80 | FLANGE | 155 | 116 | 94 | 80 |
| PRESSURE [MPa] | | | PART | AIR FLOW RATE [L] | | | | PART | AIR FLOW RATE [L] | | | | PART | AIR FLOW RATE [L] | | | | PART | AIR FLOW RATE [L] | | | |
| | | | | 10 | 20 | | 30 | | 10 | 20 | | 30 | | 10 | 20 | | 30 | | 10 | 20 | | 30 |
| | | | INLET | 0.1 | 0.1 | | 0.1 | INLET | 0.1 | 0.1 | | 0.1 | INLET | 0.1 | 0.1 | | 0.1 | INLET | 0.1 | 0.1 | | 0.1 |
| | | | OUTLET | 0.1 | — | | — | OUTLET | 0.1 | — | | — | OUTLET | 0.1 | — | | — | OUTLET | 0.1 | — | | — |
| | | | PRESSURE LOSS | — | — | | — | PRESSURE LOSS | — | — | | — | PRESSURE LOSS | — | — | | — | PRESSURE LOSS | — | — | | — |

# SUBSTRATE PROCESSING APPARATUS

CROSS-REFERENCE TO RELATED APPLICATION

This application claims the benefit of Japanese Patent Application Nos. 2019-113135 and 2020-028711 filed on Jun. 18, 2019, and Feb. 21, 2020, respectively, the entire disclosures of which are incorporated herein by reference.

TECHNICAL FIELD

The various aspects and embodiments described herein pertain generally to a substrate processing apparatus.

BACKGROUND

There is known a substrate processing apparatus configured to perform preset processings on a substrate such as a wafer.

Patent Document 1 describes a plasma processing apparatus equipped with a sidewall member which covers a side surface of an inner wall of a processing chamber. Further, Patent Document 2 discloses a substrate processing apparatus including a cylindrical chamber having an opening, a deposition shield disposed along an inner wall of the chamber and having an opening at a position corresponding to the opening of the chamber, and a shutter configured to open or close the opening of the deposition shield.

Patent Document 1: Japanese Patent Laid-open Publication No. 2012-138497

Patent Document 2: Japanese Patent Laid-open Publication No. 2015-126197

SUMMARY

In one exemplary embodiment, a substrate processing apparatus includes a chamber having a plasma processing space, a sidewall of the chamber having an opening for transferring a substrate into the plasma processing space; and a shutter disposed at an inner side than the sidewall and configured to open or close the opening, the shutter having a flow path for a temperature-controlled fluid.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 7A to FIG. 7F are graphs showing a relationship between a temperature of a valve body and a manipulated variable of a heater;

FIG. 9 is a diagram illustrating an example of a simulation showing, in the valve bodies of the first to fourth examples, temperatures of the valve bodies and flanges and pressures at inlets and outlets of the flow paths when a flow rate of dry air is varied.

DETAILED DESCRIPTION

Figure 1:
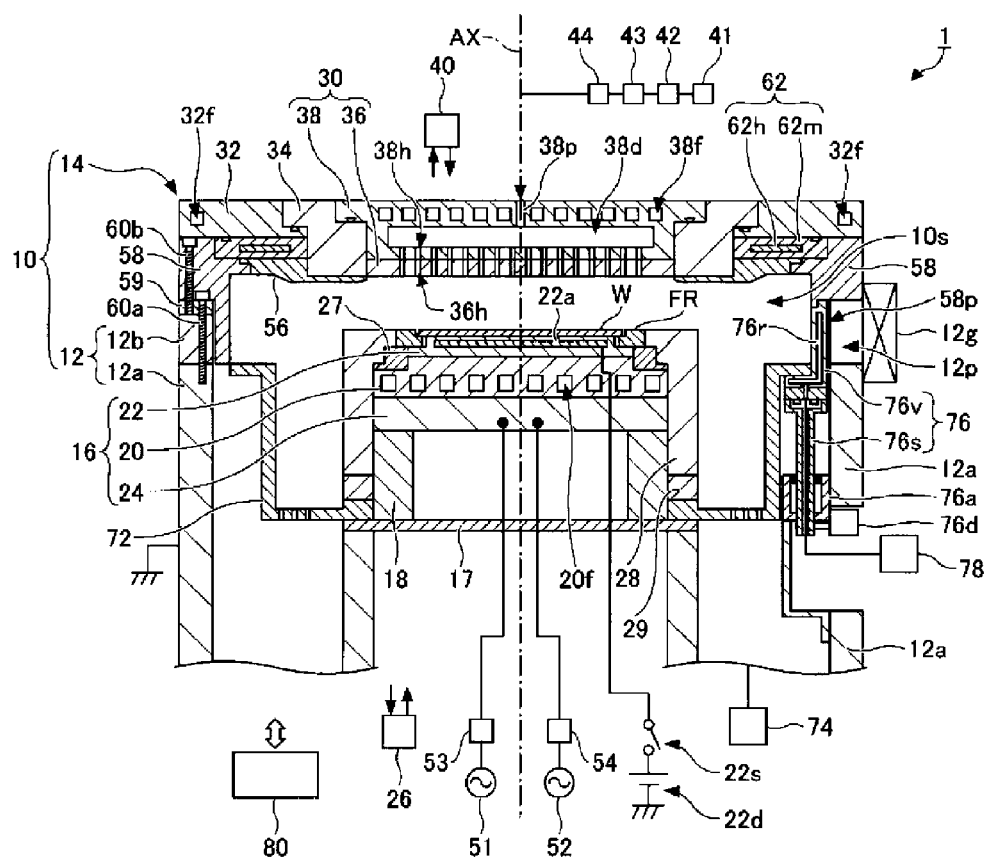
FIG. 1 is a diagram schematically illustrating a plasma processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described in detail with reference to the accompanying drawings. In the various drawings, same or corresponding parts will be assigned same reference numerals.

Figure 2:
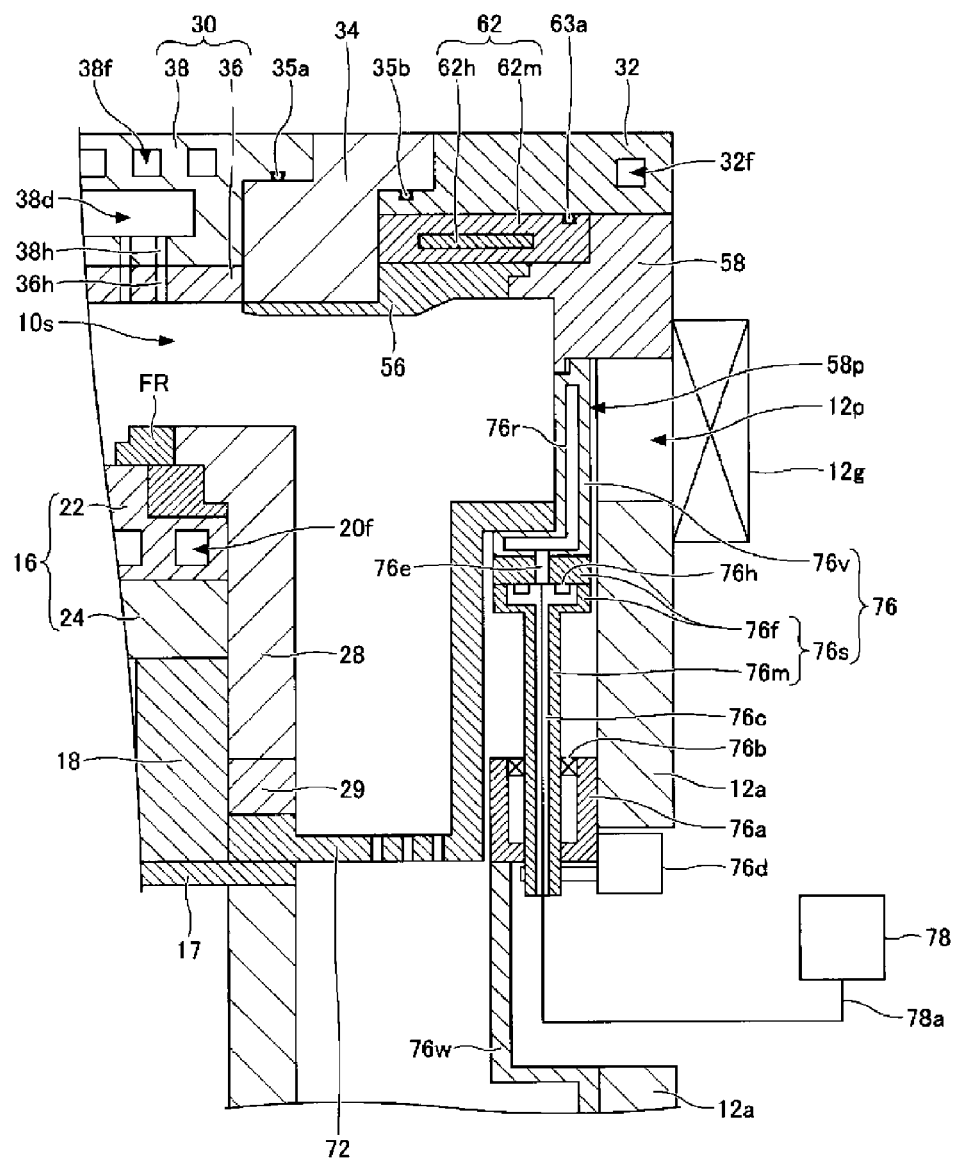
FIG. 2 is a partially enlarged cross sectional view of the plasma processing apparatus shown in FIG. 1.
Figure 3:
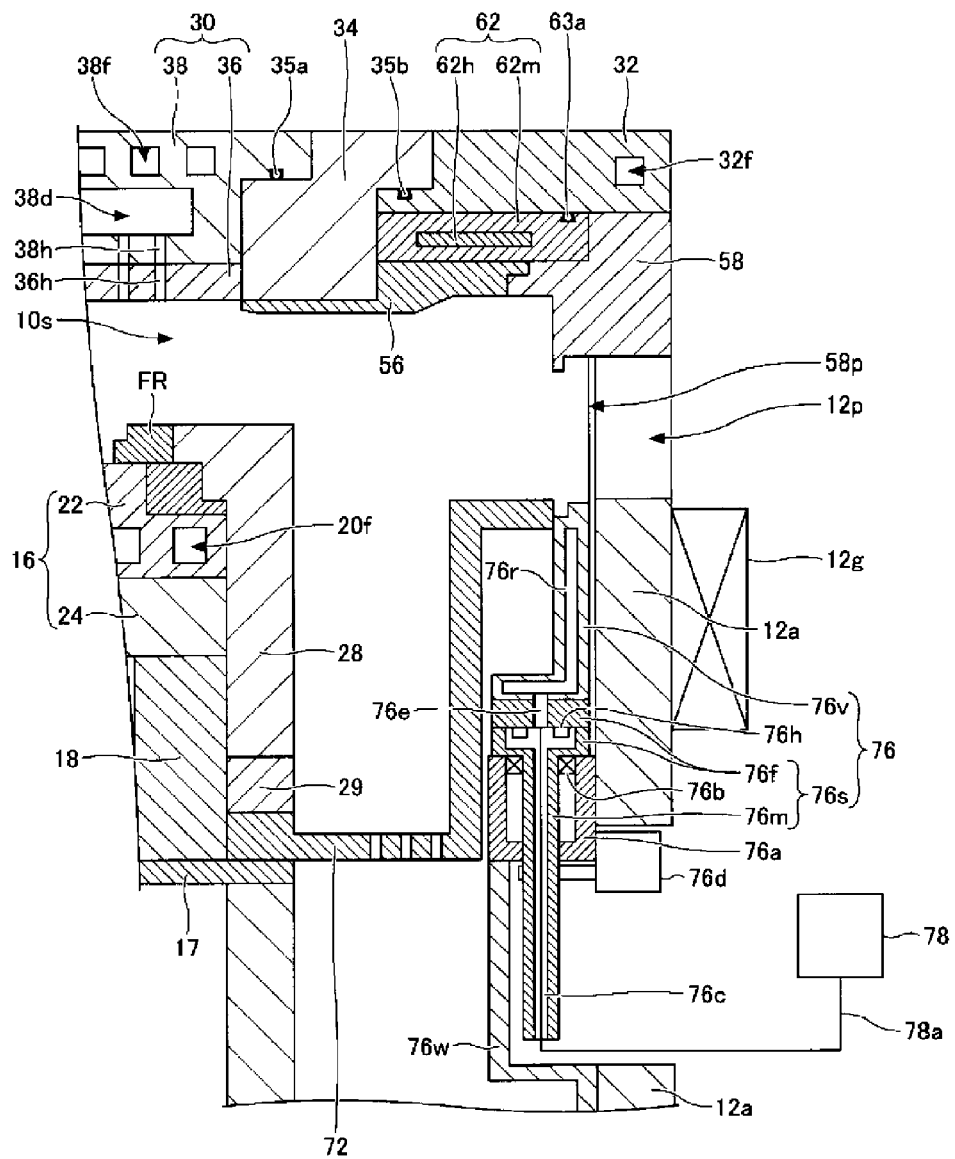
FIG. 3 is a partially enlarged cross sectional view of the plasma processing apparatus shown in FIG. 1.

A plasma processing apparatus (substrate processing apparatus) 1 according to an exemplary embodiment will be explained with reference to FIG. 1 to FIG. 3. FIG. 1 is a diagram schematically illustrating the plasma processing apparatus according to the present exemplary embodiment. FIG. 2 and FIG. 3 are partially enlarged cross sectional views of the plasma processing apparatus shown in FIG. 1. FIG. 2 illustrates a state where a valve body of an example shutter device closes a corresponding opening. Further, FIG. 3 illustrates a state where the valve body of the example shutter device opens the corresponding opening. The plasma processing apparatus 1 shown in FIG. 1 to FIG. 3 is equipped with a chamber 10. The chamber 10 has an internal space 10s therein. The internal space 10s can be decompressed. Plasma is formed in this internal space 10s. That is, the chamber 10 has a plasma processing space therein.

In the exemplary embodiment, the chamber 10 may include a chamber body 12 and a ceiling member 14. The chamber body 12 forms a sidewall and a bottom of the chamber 10. The chamber body 12 has a substantially cylindrical shape. A central axis of the chamber body 12 substantially coincides with an axis AX which extends in a vertical direction. The chamber body 12 is electrically grounded. The chamber body 12 is made of, by way of non-limiting example, aluminum. A corrosion-resistant film is formed on a surface of the chamber body 12. The corrosion-resistant film is made of a material such as, but not limited to, aluminum oxide or yttrium oxide.

An opening (an opening portion, a first opening portion) 12p is formed at the sidewall of the chamber 10. The opening 12p is provided by the chamber body 12. The opening 12p can be opened or closed by a gate valve 12g. A substrate W passes through the opening 12p when it is transferred between the internal space 10s and an outside of the chamber 10. That is, the sidewall of the chamber 10 has the opening 12p through which the substrate W is transferred with respect to the plasma processing space.

In the present exemplary embodiment, the chamber body 12 includes a first member 12a and a second member 12b. The first member 12a has a substantially cylindrical shape. The first member 12a forms the bottom and a part of the sidewall of the chamber 10. The second member 12b has a substantially cylindrical shape. The second member 12b is provided on top of the first member 12a. The second member 12b forms the rest part of the sidewall of the chamber 10. The second member 12b is provided with the opening 12p.

A support (supporting table) 16 is provided in the internal space 10s. The support 16 is configured to support the substrate W placed thereon. A bottom plate 17 is provided under the support 16. The bottom plate 17 is supported by the bottom of the chamber 10, for example, the first member 12a. A supporting body 18 extends upwards from the bottom plate 17. The supporting body 18 has a substantially cylindrical shape. The supporting body 18 is formed of an insulator such as, but not limited to, quartz. The support 16 is mounted on and supported by the supporting body 18.

The support 16 includes a lower electrode 20 and an electrostatic chuck 22. The support 16 may further include an electrode plate 24. The electrode plate 24 has a substantially disk shape. A central axis of the electrode plate 24 substantially coincides with the axis AX. The electrode plate 24 is made of a conductor such as, but not limited to, aluminum.

The lower electrode 20 is provided on the electrode plate 24. The lower electrode 20 is electrically connected with the electrode plate 24. The lower electrode 20 has a substantially disk shape. A central axis of the lower electrode 20 substantially coincides with the axis AX. The lower electrode 20 is made of a conductor such as, but not limited to, aluminum. A path 20f is formed within the lower electrode 20. The path 20f extends in, for example, a spiral shape. A coolant is supplied into the path 20f from a chiller unit 26. The chiller unit 26 is provided at the outside of the chamber 10. The chiller unit 26 supplies, for example, the coolant in a liquid phase into the path 20f. The coolant supplied into the path 20f is returned back into the chiller unit 26.

The electrostatic chuck 22 is provided on the lower electrode 20. The electrostatic chuck 22 includes a main body and an electrode 22a. The main body of the electrostatic chuck 22 has a substantially disk shape. A central axis of the electrostatic chuck 22 substantially coincides with the axis AX. The main body of the electrostatic chuck 22 is formed of ceramic. The electrode 22a is a film made of a conductor. The electrode 22a is provided within the main body of the electrostatic chuck 22. The electrode 22a is connected with a DC power supply 22d via a switch 22s. To hold the substrate W on the electrostatic chuck 22, a voltage is applied to the electrode 22a from the DC power supply 22d. If the voltage is applied to the electrode 22a, an electrostatic attraction force is generated between the electrostatic chuck 22 and the substrate W. The substrate W is attracted to and held by the electrostatic chuck 22 by the generated electrostatic attraction force. The plasma processing apparatus 1 may be provided with a gas line through which a heat transfer gas (for example, a helium gas) is supplied into a gap between the electrostatic chuck 22 and a rear surface of the substrate W.

A focus ring FR is placed on a peripheral portion of the electrostatic chuck 22 to surround the substrate W. The focus ring FR is used to improve in-surface uniformity of a plasma processing upon the substrate W. The focus ring FR is formed of, by way of non-limiting example, silicon, quartz or silicon carbide. A ring 27 is provided between the focus ring FR and the lower electrode 20. The ring 27 is made of an insulator.

In the exemplary embodiment, the plasma processing apparatus 1 may be further equipped with a cylindrical member 28 and a cylindrical member 29. The cylindrical member 28 extends along outer side surfaces of the support 16 and the supporting body 18. The cylindrical member 28 is provided on top of the cylindrical member 29. The cylindrical member 28 is made of an insulator having corrosion resistance. By way of non-limiting example, the cylindrical member 28 is made of, for example, quartz. The cylindrical member 29 extends along the outer side surface of the supporting body 18. The cylindrical member 29 is made of an insulator having corrosion resistance. By way of non-limiting example, the cylindrical member 29 is made of, for example, quartz.

The ceiling member 14 is configured to close a top opening of the chamber 10. The ceiling member 14 includes an upper electrode 30. The ceiling member 14 may further include a member 32 and a member 34. The member 32 is a substantially annular plate and made of a metal such as aluminum. The member 32 is provided on the sidewall of the chamber 10 with a member 58 to be described later therebetween. The member 32 is provided with a flow path 32f formed therein. The flow path 32f extends within the member 32 along the entire circumference of the annular member 32 one round. A coolant from a chiller unit 40 is supplied into the flow path 32f. The chiller unit 40 is provided at the outside of the chamber 10. The chiller unit 40 is configured to supply the coolant (for example, cooling water) in a liquid phase into the flow path 32f. The coolant supplied into the flow path 32f is returned back into the chiller unit 40. This chiller unit 40 is capable of supplying the coolant into the flow path 32f at a flow rate equal to or larger than, e.g., 4 L/min. The member 34 is provided between the upper electrode 30 and the member 32. The member 34 extends in a circumferential direction around the axis AX. The member 34 is made of an insulator such as, but not limited to, quartz. Further, a sealing member 35a such as an O-ring is provided between the upper electrode 30 and the member 34, and a sealing member 35b such as an O-ring is provided between the member 34 and the member 32.

The upper electrode 30 includes a ceiling plate 36 and a supporting body 38. The ceiling plate 36 has a substantially disk shape. The ceiling plate 36 is in contact with the internal space 10s. The ceiling plate 36 is provided with a multiple number of gas discharge holes 36h. These gas discharge holes 36h are formed through the ceiling plate 36 in a plate thickness direction thereof (vertical direction). This ceiling plate 36 is made of, by way of example, but not limitation, silicon, aluminum oxide or quartz. Alternatively, the ceiling plate 36 may have a structure in which a corrosion-resistant film is formed on a surface of a member which is made of a conductor such as aluminum. This corrosion-resistant film may be made of a material such as, but not limited to, aluminum oxide or yttrium oxide.

The supporting body 38 is provided on the ceiling plate 36. The supporting body 38 supports the ceiling plate 36 in a detachable manner. The supporting body 38 is made of, by way of non-limiting example, aluminum. The supporting body 38 is provided with a path 38f. The path 38f extends in, for example, a spiral shape within the supporting body 38. A coolant is supplied into the path 38f from a chiller unit 40. The chiller unit 40 supplies the coolant in a liquid phase (for example, cooling water) into the path 38f. The coolant supplied into the path 38f is returned back into the chiller unit 40. This chiller unit 40 is capable of supplying the coolant into the path 38f at a flow rate equal to or larger than, e.g., 4 L/min.

A gas diffusion space 38d is formed within the supporting body 38. The supporting body 38 is also provided with a multiple number of holes 38h. These holes 38h extend downwards from the gas diffusion space 38d and respectively connected to the gas discharge holes 36h. The supporting body 38 is further provided with a port 38p. The port 38p is connected to the gas diffusion space 38d. A gas source group 41 is connected to this port 38p via a valve group 42, a flow rate controller group 43 and a valve group 44.

The gas source group 41 includes a plurality of gas sources. The valve group 42 and the valve group 44 include a plurality of valves, respectively. The flow rate controller group 43 includes a plurality of flow rate controllers. Each of the flow rate controllers may be a mass flow controller or a pressure control type flow rate controller. Each of the gas sources belonging to the gas source group 41 is connected to the port 38p via a corresponding valve belonging to the valve group 42, a corresponding flow rate controller belonging to the flow rate controller group 43, and a corresponding valve belonging to the valve group 44. In the plasma processing apparatus 1, gases from one or more gas sources selected from the plurality of gas sources belonging to the gas source group 41 are supplied into the gas diffusion space 38d. The gases supplied into the gas diffusion space 38d is then introduced into the internal space 10s through the gas discharge holes 36h.

The plasma processing apparatus 1 is further equipped with a first radio frequency power supply 51 and a second radio frequency power supply 52. The first radio frequency power supply 51 is configured to generate a first radio frequency power for plasma formation. A frequency of the first radio frequency power is equal to or higher than, e.g., 27 MHz. The first radio frequency power supply 51 is electrically connected to the lower electrode 20 via a matching device 53. The matching device 53 is equipped with a matching circuit configured to match an impedance at a load side (lower electrode 20 side) with an output impedance of the first radio frequency power supply 51. Further, the first radio frequency power supply 51 may not be connected to the lower electrode 20 but be connected to the upper electrode 30 via the matching device 53.

The second radio frequency power supply 52 is configured to generate a second radio frequency power for ion attraction into the substrate W. A frequency of the second radio frequency power is equal to or lower than, e.g., 13.56 MHz. The second radio frequency power supply 52 is electrically connected to the lower electrode 20 via a matching device 54. The matching device 54 is equipped with a matching circuit configured to match the impedance at the load side (lower electrode 20 side) with an output impedance of the second radio frequency power supply 52.

The plasma processing apparatus 1 is further equipped with the member 58 (a deposition shield, a ring-shaped protection member). The member 58 is partially disposed within the internal space 10s. Further, the member 58 defines the plasma processing space. That is, a part of the member 58 is exposed to the plasma within the internal space 10s. The member 58 extends from the internal space 10s toward the outside of the chamber 10 and exposed to a space at the outside of the chamber 10.

In the exemplary embodiment, the member 58 extends along an inner wall surface of the chamber 10 to suppress a by-product caused by the plasma processing from being deposited on the inner wall surface of the chamber 10. That is, the member 58 protects the inner wall surface of the chamber 10. To elaborate, the member 58 extends along an inner wall surface of the chamber body 12 or an inner wall surface of the second member 12b. The member 58 has a ring shape (a substantially cylindrical shape). The member 58 may be fabricated by forming a corrosion-resistance film on a surface of a member made of a conductor such as aluminum. The corrosion-resistance film is made of a material such as, but not limited to, aluminum oxide or yttrium oxide.

In the present exemplary embodiment, the member 58 is held between the chamber body 12 and the ceiling member 14. By way of example, the member 58 is held between the second member 12b of the chamber body 12 and the member 32 of the ceiling member 14.

In the exemplary embodiment, the plasma processing apparatus 1 further includes a spacer 59. The spacer 59 is of a plate shape and extends in the circumferential direction around the axis AX. The spacer 59 is provided between the member 58 and the chamber 10. The spacer 59 is made of, by way of example, a conductor. The spacer 59 may be made of a material having thermal conductivity lower than thermal conductivity of aluminum. By way of non-limiting example, the spacer 59 may be made of stainless steel. However, the material of the spacer 59 is not limited to the stainless steel as long as the material has thermal conductivity lower than the thermal conductivity of the aluminum. By way of another example, the spacer 59 may be made of aluminum.

In the exemplary embodiment, the spacer 59 is provided between the member 58 and the second member 12b. In the exemplary embodiment, the spacer 59 and the second member 12b are fixed to the first member 12a by using a screw 60a. The screw 60a is screwed into a screw hole of the first member 12a after penetrating the spacer 59 and the second member 12b. The member 58 is fixed to the spacer 59 by using a screw 60b. The screw 60b is screwed into a screw hole of the spacer 59 after penetrating the member 58. According to the present exemplary embodiment, even if the member 58 is separated from the chamber 10 for the purpose of, for example, maintenance thereof, the spacer 59 and the second member 12b are kept fixed to the first member 12a by the screw 60a. Accordingly, while maintaining the spacer 59 and the second member 12b fixed to the first member 12a, the member 58 can be separated from the chamber 10.

In the exemplary embodiment, the plasma processing apparatus 1 is further equipped with a heater unit 62. The heater unit 62 includes a main body 62m and a heater 62h. The heater 62h is configured to heat the member 58. The heater 62h may be a resistance heating element. The heater 62h is provided within the main body 62m. The main body 62m is thermally in contact with the member 58. In the exemplary embodiment, the main body 62m is physically in contact with the member 58. The main body 62m is formed of a conductor such as aluminum. The heater 62h is configured to heat the member 58 via the main body 62m.

In the present exemplary embodiment, the main body 62m has a substantially ring-shaped plate and extends in the circumferential direction to surround the upper electrode 30. In the present exemplary embodiment, the ceiling member 14 further includes a member 56. The member 56 is a substantially ring-shaped plate. The member 56 extends in the circumferential direction in a region at an outside of the ceiling plate 36 in a diametrical direction thereof. The diametrical direction is a radial direction with respect to the axis AX. The heater unit 62 is disposed between the member 56 and the member 32 and, also, between the member 34 and the member 58.

A sealing member such as an O-ring is provided between the main body 62m and nearby members to separate a decompressed environment including the internal space 10s from an atmospheric environment. To elaborate, a sealing member 63a is provided between the main body 62m and the member 32.

In the exemplary embodiment, a baffle member 72 is provided between the member 58 and the supporting body 18. In the exemplary embodiment, the baffle member 72 has a substantially cylindrical shape. An upper end of the baffle member 72 is formed to have a flange shape. A lower end of the baffle member 72 is formed to have a substantially ring shape and extends inwards in the diametrical direction. An outer peripheral portion of the upper end of the baffle member 72 is coupled to a lower end of the member 58. An inner peripheral portion of the lower end of the baffle member 72 is held between the cylindrical member 29 and the bottom plate 17. The baffle member 72 is formed of a plate made of a conductor such as aluminum. A corrosion-resistance film is formed on a surface of the baffle member 72. The corrosion-resistance film is made of a material such as, but not limited to, aluminum oxide or yttrium oxide. The baffle member 72 is provided with a plurality of through holes.

The internal space 10s includes a gas exhaust region extending under the baffle member 72. A gas exhaust device 74 is connected to this gas exhaust region. The gas exhaust device 74 includes a pressure controller such as an automatic pressure control valve and a decompression pump such as a turbo molecular pump.

The member 58 is provided with an opening (second opening portion) 58p. The opening 58p is formed at the member 58 to face the opening 12p. The substrate W passes through the opening 12p and the opening 58p when it is transferred between the internal space 10s and the outside of the chamber 10.

The plasma processing apparatus 1 may be further equipped with a shutter device 76. The shutter device 76 is configured to open or close the opening 58p. Further, the shutter device 76 is also configured to open or close the opening 12p through which the substrate W is transferred with respect to the plasma processing space. The shutter device 76 has a valve body 76v (shutter) and a shaft body 76s. The shutter device 76 may further include a cylindrical body 76a, a sealing member 76b, a wall member 76w and a driving unit 76d.

The valve body 76v is configured to close the opening 58p in the state that it is placed within the opening 58p. Further, the valve body 76v is placed inside the sidewall of the chamber 10 to open or close the opening 12p through which the substrate W is transferred into the plasma processing space. The valve body 76v is supported by the shaft body 76s. That is, the shaft body 76s is connected to the valve body 76v. The shaft body 76s extends downwards from the valve body 76v. The shaft body 76s includes a main member 76m and a flange 76f. The main member 76m has a substantially cylindrical shape. That is, the shaft body 76s has a cavity 76c therein. The flange 76f is provided on an upper end of the main body 76m. The valve body 76v is provided on the flange 76f. The cavity 76c of the shaft body 76s is also formed within the flange 76f. A heater 76h is provided within the flange 76f. The heater 76h is, for example, a resistance heating element. The heater 76h is configured to heat the valve body 76v via the flange 76f.

Provided within the valve body 76v is a flow path 76r through which a temperature-controlled fluid (a coolant or a heat transfer medium) flows. The temperature-controlled fluid is introduced into the flow path 76r via an inlet line 78a which passes through the cavity 76c. The temperature-controlled fluid is circulated through the flow path 76r and then exhausted from the cavity 76c. Further, a flowmeter configured to detect a flow rate of the temperature-controlled fluid, a regulator configured to adjust the flow rate of the temperature-controlled fluid, and the like may be further provided. A controller 80 to be described later controls the flow rate of the temperature-controlled fluid to be supplied into the flow path 76r based on a heat input amount from the plasma in the internal space 10s to the valve body 76v. Further, the controller 80 controls the heater 76h based on the heat input amount from the plasma in the internal space 10s to the valve body 76v. Accordingly, a temperature of the valve body 76v can be set to be in a required temperature range. Further, the kind of the temperature-controlled fluid is not particularly limited, and the temperature-controlled fluid may be a gas such as, but not limited to, dry air or a liquid such as, but not limited to, cooling water.

The cylindrical body 76a has a cylindrical shape. The cylindrical body 76a is directly or indirectly fixed to the chamber body 12. The main member 76m of the shaft body 76s is configured to be movable up and down through the inside of the cylindrical body 76a. The driving unit 76d is configured to generate a power for moving the main member 76m of the shaft body 76s up and down. The driving unit 76d includes, for example, a motor.

The sealing member 76b is provided within the cylindrical body 76a. The sealing member 76b closes a gap between the cylindrical body 76a and the main member 76m of the shaft body 76s, thus allowing the internal space 10s to be hermetically sealed. The sealing member 76b may be, but not limited to, an O-ring or a magnetic fluid seal. The wall member 76w extends between the cylindrical body 76a and the chamber body 12. The wall member 76w closes a gap between the cylindrical body 76a and the chamber body 12, thus allowing the internal space 10s to be hermetically sealed.

The plasma processing apparatus 1 may be further equipped with a supply (fluid supply) 78. The supply 78 is configured to supply the temperature-controlled fluid into the flow path 76r of the valve body 76v via the inlet line 78a. With one end connected to the supply 78, the inlet line 78a is inserted through the cavity 76c of the shaft body 76s, and the other end of the inlet line 78a is connected to a joint (not shown) provided at the flange 76f. An inlet path 76e connected from the joint to an inlet of the flow path 76r of the valve body 76v is formed at the flange 76f. Further, an outlet path (not shown) connected from an outlet of the flow path 76r to the cavity 76c is also formed at the flange 76f. The dry air as the temperature-controlled fluid supplied from the supply 78 is supplied to the inlet of the flow path 76r through the inlet line 78a and the inlet path 76e. The dry air is circulated in the flow path 76r and exhausted from the outlet of the flow path 76r to the outside of the apparatus via the outlet path of the flange 76f and the cavity 76c. Here, though the description has been provided for the example where the temperature-controlled fluid is the dry air and the dry air is exhausted to the outside of the apparatus, the present exemplary embodiment is not limited thereto. An exhaust line connected from the outlet path of the flange 76f to the supply 78 may be provided, and the temperature-controlled fluid may be circulated between the supply 78 and the flow path 76r of the valve body 76v.

In the present exemplary embodiment, the plasma processing apparatus 1 may be further equipped with the controller (control device) 80. The controller 80 is configured to control the individual components of the plasma processing apparatus 1. The controller 80 may be implemented by, for example, a computer device. The controller 80 includes a processor, a storage, an input device such as a keyboard, a display device and an input/output interface for signals. The storage stores therein a control program and recipe data. The processor executes the control program, and sends control signals to the individual components of the plasma processing apparatus 1 via the input/output interface according to the recipe data.

Now, an example of a configuration of the valve body 76v (76v1 to 76v4) having the flow path 76r will be further described with reference to FIG. 4A to FIG. 5D.

Valve Body of First Example

Figure 4A:
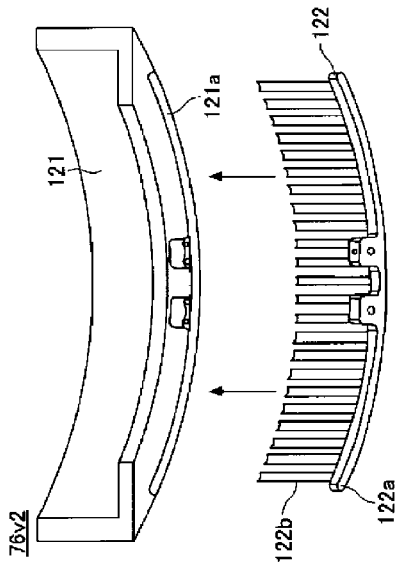
FIG. 4A to FIG. 4D provide exploded perspective views of a valve body of a first example and a valve body of a second example and perspective views illustrating a modeling of shapes of flow paths thereof.
Figure 4B:
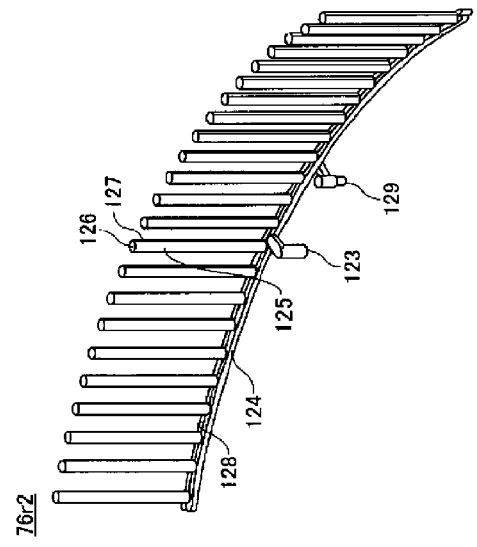

FIG. 4A is an exploded perspective view of the valve body 76v1 of a first example, and FIG. 4B is a perspective view illustrating a modeling of a shape of a flow path 76r1 in the valve body 76v1 of the first example.

The valve body 76v1 has a valve main body 111 and a flow path forming member (path module) 112. The valve main body 111 is provided with a recess 111a formed from a bottom portion thereof. The flow path forming member 112 is configured to be fitted into the recess 111a. As the flow path forming member 112 is inserted into the recess 111a, the flow path 76r1 is formed. That is, the recess 111a and the flow path forming member 112 define the flow path 76r1. The valve main body 111 and the flow path forming member 112 are welded to each other by electron beam welding or the like.

The flow path forming member 112 has an arc-shaped base 112a and an arc-shaped plate member 112b extending upwards from the base 112a. The base 112a and the arc-shaped plate member 112b are provided with grooves for forming the flow paths 76r1. Further, the recess 111a of the valve main body 111 has a shape in which the base 112a and the arc-shaped plate member 112b can be inserted.

The flow path 76r1 has an inlet 113, paths 114 to 118 and an outlet 119. When the valve body 76v1 is fixed to the flange 76f, the inlet 113 communicates with the inlet path 76e formed at the flange 76f. The inlet 113 is connected to the path 114. The path 114 is formed at an inner peripheral side (a side close to the support 16) of the flow path forming member 112 and extends horizontally in an arc shape to conform to the shape of the valve body 76v1. The path 115 is formed at the inner peripheral side of the flow path forming member 112 and vertically extend to connect the path 114 and the path 116. The path 116 is formed on the flow path forming member 112 and extends horizontally in an arc shape to conform to the shape of the valve body 76v1. The path 117 is formed at an outer peripheral side of the flow path forming member 112 and vertically extend to connect the path 116 and the path 118. The path 118 is formed at the outer peripheral side of the flow path forming member 112 and extends horizontally in an arc shape to conform to the shape of the valve body 76v1. The outlet 119 communicates with the outlet path (not shown) of the flange 76f when the valve body 76v1 is fixed to the flange 76f. The outlet 119 is connected to the path 118.

The temperature-controlled fluid supplied from the supply 78 is sent to the inlet 113 of the flow path 76r1 through the inlet line 78a and the inlet path 76e. The temperature-controlled fluid introduced from the inlet 113 diverges from the path 114 into the multiple paths 115 and then joins the path 116. Thereafter, the temperature-controlled fluid diverges into the multiple paths 117 again and joins the path 118. Then, the temperature-controlled fluid is outputted from the outlet 119 and exhausted to the outside of the apparatus through the outlet path (not shown) of the flange 76f and the cavity 76c.

Valve Body of Second Example

Figure 4C:
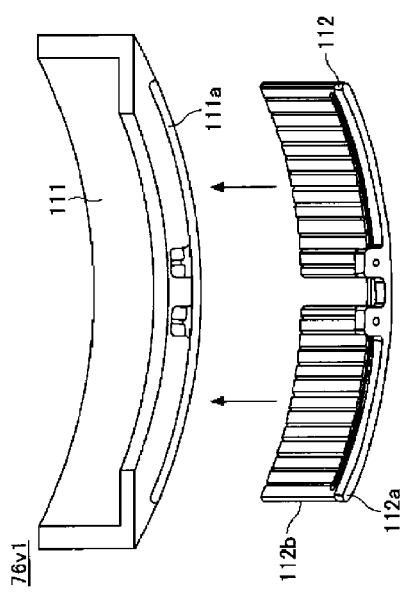
Figure 4D:
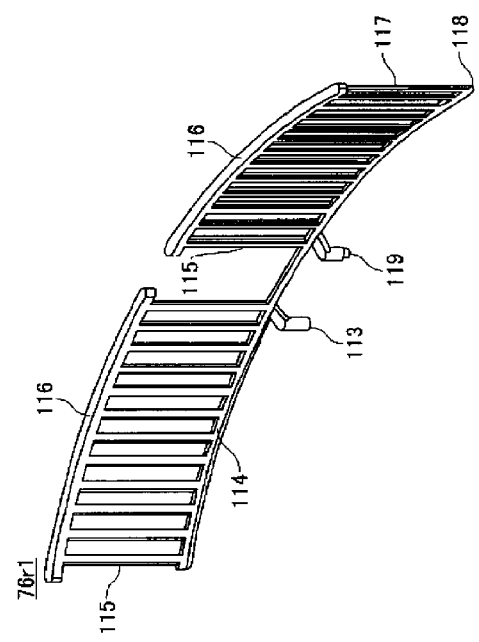

FIG. 4C is an exploded perspective view of a valve body 76v2 of a second example, and FIG. 4D is a perspective view illustrating a modeling of a shape of a flow path 76r2 in the valve body 76v2 of the second example.

The valve body 76v2 has a valve main body 121 and a flow path forming member (path module) 122. The valve main body 121 is provided with a recess 121a formed from a bottom portion thereof. The flow path forming member 122 is configured to be fitted into the recess 121a. As the flow path forming member 122 is inserted into the recess 121a, the flow path 76r2 is formed. That is, the recess 121a and the flow path forming member 122 define the flow path 76r2. The valve main body 121 and the flow path forming member 122 are welded to each other by electron beam welding or the like.

The flow path forming member 122 has an arc-shaped base 122a and plate members 122b extending upwards from the base 122a. The base 122a is provided with grooves for forming the flow paths 76r2. Further, the recess 121a of the valve main body 121 has a shape in which the base 112a can be inserted and a multiple number of holes. The plate members 122b are respectively inserted into the holes.

The flow path 76r2 has an inlet 123, paths 124 to 128 and an outlet 129. When the valve body 76v2 is fixed to the flange 76f, the inlet 123 communicates with the inlet path 76e formed at the flange 76f. The inlet 123 is connected to the path 124. The path 124 is formed at an inner peripheral side of the flow path forming member 122 and extends horizontally in an arc shape to conform to the shape of the valve body 76v2. The paths 125 are formed at the inner peripheral side of the flow path forming member 122 and vertically extend to connect the path 124 and the path 126. The path 126 is formed on the flow path forming member 122 and horizontally extends in an arc shape to conform to the shape of the valve body 76v2. The path 127 is formed at an outer peripheral side of the flow path forming member 122 and vertically extend to connect the path 126 and the path 128. The path 128 is formed at the outer peripheral side of the flow path forming member 122 and extends horizontally in an arc shape to conform to the shape of the valve body 76v2. The outlet 129 communicates with the outlet path (not shown) of the flange 76f when the valve body 76v2 is fixed to the flange 76f. The outlet 129 is connected to the path 128.

The temperature-controlled fluid supplied from the supply 78 is introduced into the inlet 123 of the flow path 76r2 through the inlet line 78a and the inlet path 76e. The temperature-controlled fluid introduced from the inlet 123 diverges from the path 124 into the multiple paths 125 and then joins the path 128 after flowing through the paths 125, 126 and 127. Then, the temperature-controlled fluid is outputted from the outlet 129 to be exhausted to the outside of the apparatus through the outlet path (not shown) of the flange 76f and the cavity 76c.

Valve Body of Third Example

Figure 5A:
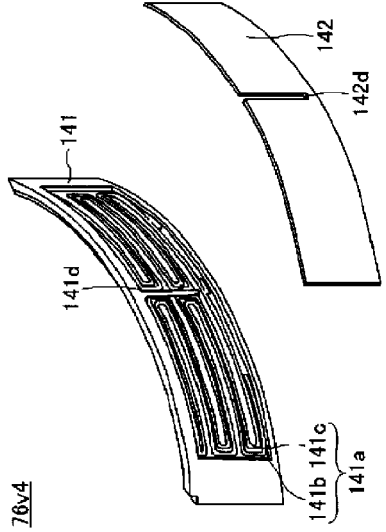
FIG. 5A to FIG. 5D present exploded perspective views of a valve body of a third example and a valve body of a fourth example and perspective views illustrating a modeling of flow paths thereof.
Figure 5B:
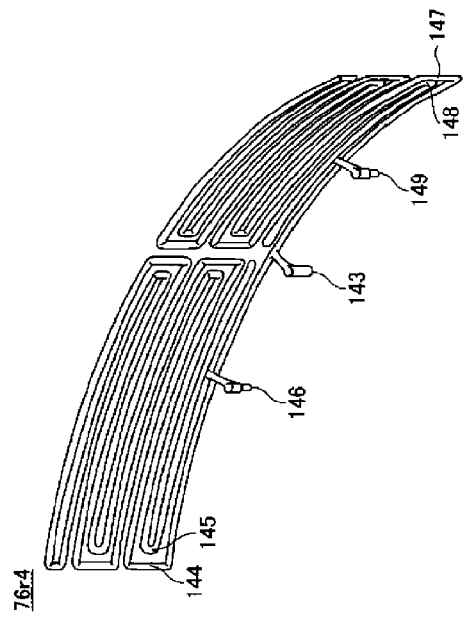

FIG. 5A is an exploded perspective view of the valve body 76v3 of a third example, and FIG. 5B is a perspective view illustrating a modeling of a shape of a flow path 76r3 in the valve body 76v3 of the third example.

The valve body 76v3 has a valve main body 131 and a cover member 132. The valve main body 131 is provided with a recess 131a formed on an outer peripheral surface thereof. The recess 131a of the valve main body 131 has a depressed portion 131b to be engaged with the cover member 132 and a groove 131c formed at a bottom surface (first face) of the depressed portion 131b. The cover member 132 covers the bottom surface (first face) of the depressed portion 131b. As the cover member 132 is fitted in the depressed portion 131b, the flow path 76r3 is formed. That is, the bottom surface (first face) of the depressed portion 131b and the cover member 132 define the flow path 76r3. The valve main body 131 and the cover member 132 are welded to each other by electron beam welding or the like.

The flow path 76r3 has an inlet 133, paths 134 and 135, an outlet 136 and paths 137 and 138, and an outlet 139. Here, the paths 134, 135, 137 and 138 are formed horizontally in a zigzag pattern. The inlet 133 communicates with the inlet path 76e formed at the flange 76f when the valve body 76v3 is fixed to the flange 76f. The inlet 133 is connected with the paths 134 and 137 branched therefrom. The path 134 is a supply path going upwards while going back and forth in the horizontal direction at one side (left side of FIG. 5B) of the valve main body 131 in the horizontal direction. The path 134 is connected with the path 135. The path 135 is a return path going downwards while going back and forth in the horizontal direction at the one side of the valve main body 131 in the horizontal direction. The path 135 is connected to the outlet 136. The outlet 136 communicates with the outlet path (not shown) formed at the flange 76f when the valve body 76v3 is fixed to the flange 76f. The path 137 is a supply path going upwards while going back and forth in the horizontal direction at the other side (right side of FIG. 5B) of the valve main body 131 in the horizontal direction. The path 138 is connected with the path 137. The path 138 is a return path going downwards while going back and forth in the horizontal direction at the other side of the valve main body 131 in the horizontal direction. The path 138 is connected to the outlet 139. The outlet 139 communicates with the outlet path (not shown) formed at the flange 76f when the valve body 76v3 is fixed to the flange 76f. Further, at the one side (left side of FIG. 5B) of the valve main body 131 in the horizontal direction, the return path 135 is disposed at an outer side (more left-handed side) than the supply path 134. Further, at the other side (right side of FIG. 5B) of the valve main body 131, the return path 138 is disposed at an outer side (more right-handed side) than the supply path 137.

The temperature-controlled fluid supplied from the supply 78 is sent to the inlet 133 of the flow path 76r3 through the inlet line 78a and the inlet path 76e. The temperature-controlled fluid introduced from the inlet 133 diverges into the paths 134 and 137. The temperature-controlled fluid in the path 134 then flows through the path 135 and is outputted from the outlet 136 and exhausted to the outside of the apparatus through the outlet path (not shown) of the flange 76f and the cavity 76c. Further, the temperature-controlled fluid in the path 137 then flows through the path 138 and is outputted from the outlet 139 and exhausted to the outside of the apparatus through the outlet path (not shown) of the flange 76f and the cavity 76c.

Furthermore, though the groove 131c for forming the paths 134, 135, 137 and 138 is formed at the valve main body 131, the present exemplary embodiment is not limited thereto. The groove 131c may be formed on an inner peripheral surface of the cover member 132, or may be formed at both the valve main body 131 and the cover member 132. That is, the path 76r3 (paths 134, 135, 137 and 138) may be defined by a groove formed on at least one of the bottom surface (first face) of the depressed portion 131b and the cover member 132.

Valve Body of Fourth Example

Figure 5C:
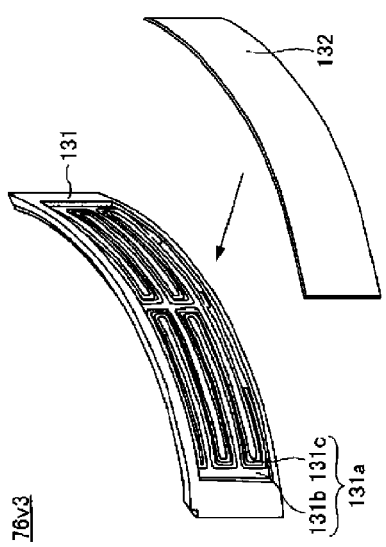
Figure 5D:
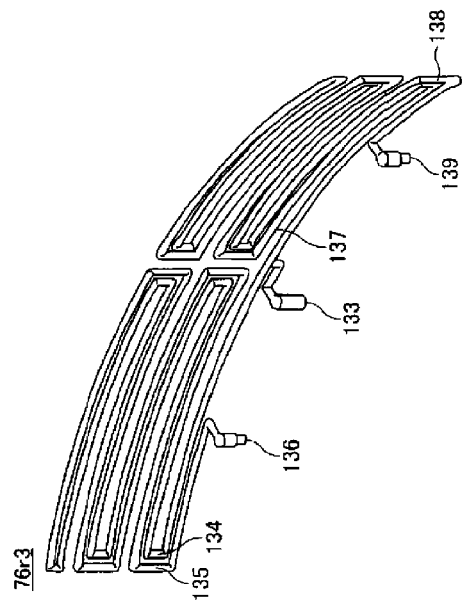

FIG. 5C is an exploded perspective view of the valve body 76v4 of a fourth example, and FIG. 5D is a perspective view illustrating a modeling of a shape of a flow path 76r4 in the valve body 76v4 of the fourth example.

The valve body 76v4 has a valve main body 141 and a cover member 142. The valve main body 141 is provided with a recess 141a formed on an outer peripheral surface thereof. The recess 141a of the valve main body 141 has a depressed portion 141b to be engaged with the cover member 142 and a groove 141c formed at a bottom surface (first face) of the depressed portion 141b. The cover member 142 covers the bottom surface (first face) of the depressed portion 141b. As the cover member 142 is fitted in the depressed portion 141b, the flow path 76r4 is formed. That is, the bottom surface (first face) of the depressed portion 141b and the cover member 142 define the flow path 76r4. The valve main body 141 and the cover member 142 are welded to each other by electron beam welding or the like.

The flow path 76r4 has an inlet 143, paths 144 and 145, an outlet 146 and paths 147 and 148, and an outlet 149. Here, the paths 144, 145, 147 and 148 are formed horizontally in a zigzag pattern. The inlet 143 communicates with the inlet path 76e formed at the flange 76f when the valve body 76v4 is fixed to the flange 76f. The inlet 143 is connected with the paths 144 and 147 branched therefrom. The path 144 is a supply path going upwards while going back and forth in the horizontal direction at one side (left side of FIG. 5D) of the valve main body 141 in the horizontal direction. The path 144 is connected with the path 145. The path 145 is a return path going downwards while going back and forth in the horizontal direction at the one side of the valve main body 141 in the horizontal direction. The path 145 is connected to the outlet 146. The outlet 146 communicates with the outlet path formed at the flange 76f when the valve body 76v4 is fixed to the flange 76f. The path 147 is a supply path going upwards while going back and forth in the horizontal direction at the other side (right side of FIG. 5D) of the valve main body 141 in the horizontal direction. The path 148 is connected with the path 147. The path 148 is a return path going downwards while going back and forth in the horizontal direction at the other side of the valve main body 141 in the horizontal direction. The path 148 is connected to the outlet 149. The outlet 149 communicates with the outlet path formed at the flange 76f when the valve body 76v4 is fixed to the flange 76f. Further, at the one side (left side of FIG.

5D) of the valve main body 141 in the horizontal direction, the supply path 144 is disposed at an outer side (more left-handed side) than the return path 145. Further, at the other side (right side of FIG. 5D) of the valve main body 141 in the horizontal direction, the supply path 147 is disposed at an outer side (more right-handed side) than the return path 148.

The temperature-controlled fluid supplied from the supply 78 is sent to the inlet 143 of the flow path 76r4 through the inlet line 78a and the inlet path 76e. The temperature-controlled fluid introduced from the inlet 143 diverges into the paths 144 and 147. The temperature-controlled fluid in the path 144 then flows through the path 145 and is outputted from the outlet 146 and exhausted to the outside of the apparatus through the outlet path (not shown) of the flange 76f and the cavity 76c. Further, the temperature-controlled fluid in the path 147 then flows through the path 148 and is outputted from the outlet 149 and exhausted to the outside of the apparatus through the outlet path (not shown) of the flange 76f and the cavity 76c.

Furthermore, though the groove 141c for forming the paths 144, 145, 147 and 148 is formed at the valve main body 141, the present exemplary embodiment is not limited thereto. The groove 141c may be formed on an inner peripheral surface of the cover member 142, or may be formed at both the valve main body 141 and the cover member 142. That is, the path 76r4 (paths 144, 145, 147 and 148) may be defined by a groove formed on at least one of the bottom surface (first face) of the depressed portion 141b and the cover member 142.

Further, as in the valve bodies 76v3 and 76v4 shown in the third and fourth examples, a processing of forming the recesses 131a and 141a (the depressed portions 131b and 141b and the grooves 131c and 141c) on the outer peripheral surface of the valve main bodies 131 and 141 is easy, and a manufacturing cost thereof can be reduced. Moreover, since the shapes of the cover members 132 and 142 in the third and fourth examples are simple, the manufacturing cost thereof can be further reduced.

In addition, in the configuration where the temperature-controlled fluid is supplied from a central bottom portion of the valve main body 141 in a circumferential direction thereof, an inner peripheral surface of the valve body 76v has a thermal distribution in which a temperature of the central bottom portion in the circumferential direction is low and the temperature increases toward an upper outer peripheral portion of the valve main body 141 in the circumferential direction. As in the fourth example, by disposing the supply paths 144 and 147 at the outer side than the return paths 145 and 148, an outer peripheral portion of the valve main body 141 in the circumferential direction can be appropriately cooled, so that a temperature difference in the thermal distribution on the inner peripheral surface of the valve body 76v can be reduced.

Moreover, as depicted in FIG. 5C, in the valve body 76v4 of the fourth example, the valve main body 141 has a partition portion 141d, which is not depressed, at a central portion of the depressed portion 141b in the circumferential direction. Further, the cover member 142 has a notch 142d at a position corresponding to the partition portion 141d. With this configuration, when the cover member 142 is welded to the valve main body 141, the cover member 142 can be firmly attached to the bottom surface of the depressed portion 141b.

So far, the valve bodies 76v1 to 76v4 shown in FIG. 4A to FIG. 5D have been described as the valve body 76v having the flow path 76r. However, the structure of the valve body 76v and the structure of the flow path 76r are not limited to the shown examples.

Figure 6A:
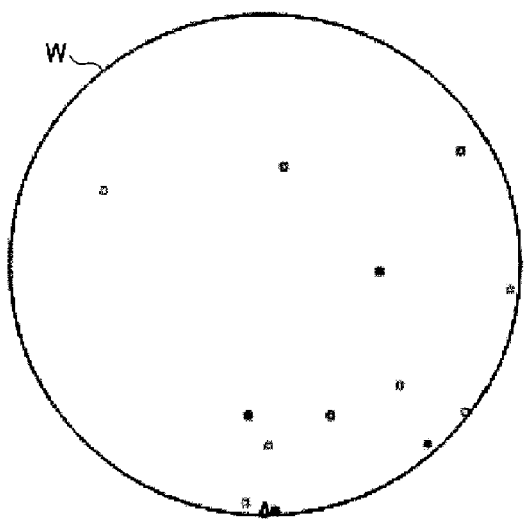
FIG. 6A and FIG. 6B are diagrams illustrating positions and the number of particles adhering to a substrate.
Figure 6B:
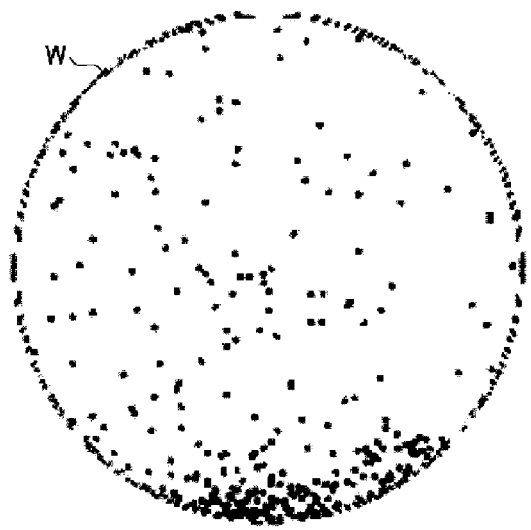

FIG. 6A and FIG. 6B are diagrams showing positions and the number of particles adhering to the substrate W when an etching processing is performed on the substrate W in plasma processing apparatuses. FIG. 6A illustrates a case of the plasma processing apparatus 1 according to the present exemplary embodiment, and FIG. 6B illustrates a case of a plasma processing apparatus according to a reference example. Here, the plasma processing apparatus of the reference example is different from the plasma processing apparatus 1 of the present exemplary embodiment in that the valve body 76v thereof is not provided with the flow path 76r. The other configurations of the plasma processing apparatus of the reference example are the same as those of the plasma processing apparatus 1 of the present exemplary embodiment, and redundant description thereof will be omitted. Further, in FIG. 6A and FIG. 6B, it is assumed that the valve body 76v (the opening 12p and the opening 58p) is located at a lower portion.

In the plasma processing apparatus 1 of the present exemplary embodiment and the plasma processing apparatus of the reference example, the etching processing is performed on the substrate W under the following conditions.

Pressure: 10 mTorr to 30 mTorr
Gas kinds: $C_4F_6/C_4F_8/NF_3/O_2$
First radio frequency power: 5000 W to 6000 W
Second radio frequency power: 10000 W to 20000 W
DC: −500 W to −1000 W
Further, when the etching processing is performed, particles are generated within the chamber 10, and the generated particles adhere to the inner wall surface of the chamber 10 and the substrate W. FIG. 6A and FIG. 6B show particles having a size equal to or larger than 0.035 μm upon a lapse of 10 hours.

As depicted in FIG. 6B, in the plasma processing apparatus of the reference example, the number of the particles on the substrate W is 293. Further, it is found out that the positions of the particles are biased toward the valve body 76v.

In contrast, as shown in FIG. 6A, in the plasma processing apparatus 1 according to the present exemplary embodiment, the number of the particles on the substrate W is 13. Further, no bias in the position distribution of the particles is observed.

As described above, in the plasma processing apparatus 1 according to the present exemplary embodiment, the valve body 76v is provided with the flow path 76r in which the temperature-controlled fluid flows. With this configuration, heat of the valve body 76v can be radiated to the temperature-controlled fluid, so that the temperature of the inner peripheral surface of the valve body 76v can be lowered. Thus, by controlling the heater 76h, the controller 80 is capable of adjusting the temperature of the valve body 76v.

Further, the controller 80 controls the temperature of the valve body 76v such that a temperature difference between the member 58 and the valve body 76v is reduced. In the plasma processing apparatus 1 according to the present exemplary embodiment, a temperature difference in a cylindrical surface formed by the inner peripheral surface of the member 58 and the inner peripheral surface of the valve body 76v can be reduced. Accordingly, temperature uniformity in the circumferential direction of the internal space 10s can be improved.

Moreover, as the temperature of the valve body 76v is lowered, the particles adhere to the inner peripheral surface of the valve body 76v. That is, by trapping the particles in the internal space 10s on the inner peripheral surface of the valve body 76v, the number of the particles on the substrate W can be reduced. Likewise, as the temperature of the member 58 is lowered, the particles adhere to the inner peripheral surface of the member 58. That is, by trapping the particles in the internal space 10s on the inner peripheral surface of the member 58, the number of the particles on the substrate W can be reduced.

That is, in the plasma processing apparatus 1 according to the present exemplary embodiment, the number of the particles adhering to the substrate W can be reduced, and the bias in the position distribution of the particles can be reduced.

Now, a method of setting the flow rate of the dry air (temperature-controlled fluid) supplied to the valve body 76v from the supply 78 and setting the temperature of the valve body 76v will be explained with reference to FIG. 7A to FIG. 7F.

FIG. 7A to FIG. 7F are graphs showing a relationship between the temperature of the valve body 76v and a manipulated variable (MV) of the heater 76h. The graphs (FIG. 7A and FIG. 7B) in the left-hand column illustrate a case where the flow rate of the dry air is set to be 30 L/min and a set temperature of the valve body 76v is 120° C. Here, the set temperature of the valve body 76v is a temperature of the heater 76h which heats the valve body 76v. The graphs (FIG. 7C and FIG. 7D) in the middle column illustrate a case where the flow rate of the dry air is set to be 60 L/min and the set temperature of the valve body 76v is 120° C. The graphs (FIG. 7E and FIG. 7F) in the right-hand column illustrate a case where the flow rate of the dry air is set to be 60 L/min and the set temperature of the valve body 76v is 100° C. Further, the graphs (FIG. 7A, FIG. 7C and FIG. 7E) in the upper row illustrate a variation of the temperature of the valve body 76v with a lapse of time in the etching processing, and the graphs (FIG. 7B, FIG. 7D and FIG. 7F) in the lower row illustrate a variation of the temperature of the valve body 76v and a variation of the manipulated variable of the heater 76h with a lapse of time when the manipulated variable of the heater 76h is controlled to allow the valve body 76v to reach the set temperature in the etching processing. Further, a temperature T1 is a temperature of the member 58 while the valve body 76v closes the opening 58p of the member 58, and a temperature T2 is a temperature of the member 58 while the valve body 76v opens the opening 58p of the member 58.

When the flow rate of the dry air is set to be 30 L/min and the set temperature of the valve body 76v is set to be 120° C., the temperature of the valve body 76v exceeds the temperature T1, as shown in FIG. 7A, which indicates that the valve body 76v has insufficient cooling capability. Further, as can be seen from FIG. 7B, the temperature of the valve body 76v cannot be maintained constant even when the manipulated variable of the heater 76h is set to be zero (0).

When the flow rate of the dry air is set to be 60 L/min and the set temperature of the valve body 76v is set to be 100° C., the temperature of the valve body 76v is maintained within a range between the temperature T1 and the temperature T2, as shown in FIG. 7E. As can be seen from FIG. 7F, however, the temperature of the valve body 76v cannot be maintained constant even when the manipulated variable of the heater 76h is set to be zero (0).

Meanwhile, when the flow rate of the dry air is set to be 60 L/min and the set temperature of the valve body 76v is set to be 120° C., the temperature of the valve body 76v is maintained within the range between the temperature T1 and the temperature T2, as shown in FIG. 7C. Further, as can be seen from FIG. 7D, the temperature of the valve body 76v can be maintained constant even within a range where the manipulated variable of the heater 76h is controllable.

As stated above, the flow rate of the dry air and the set temperature of the valve body 76v can be determined to allow the temperature of the valve body 76v to fall within the range between the temperature T1 and the temperature T2 and to maintain the temperature of the valve body 76v constant within the range in which the manipulated variable of the heater 76h is controllable.

Figure 8:
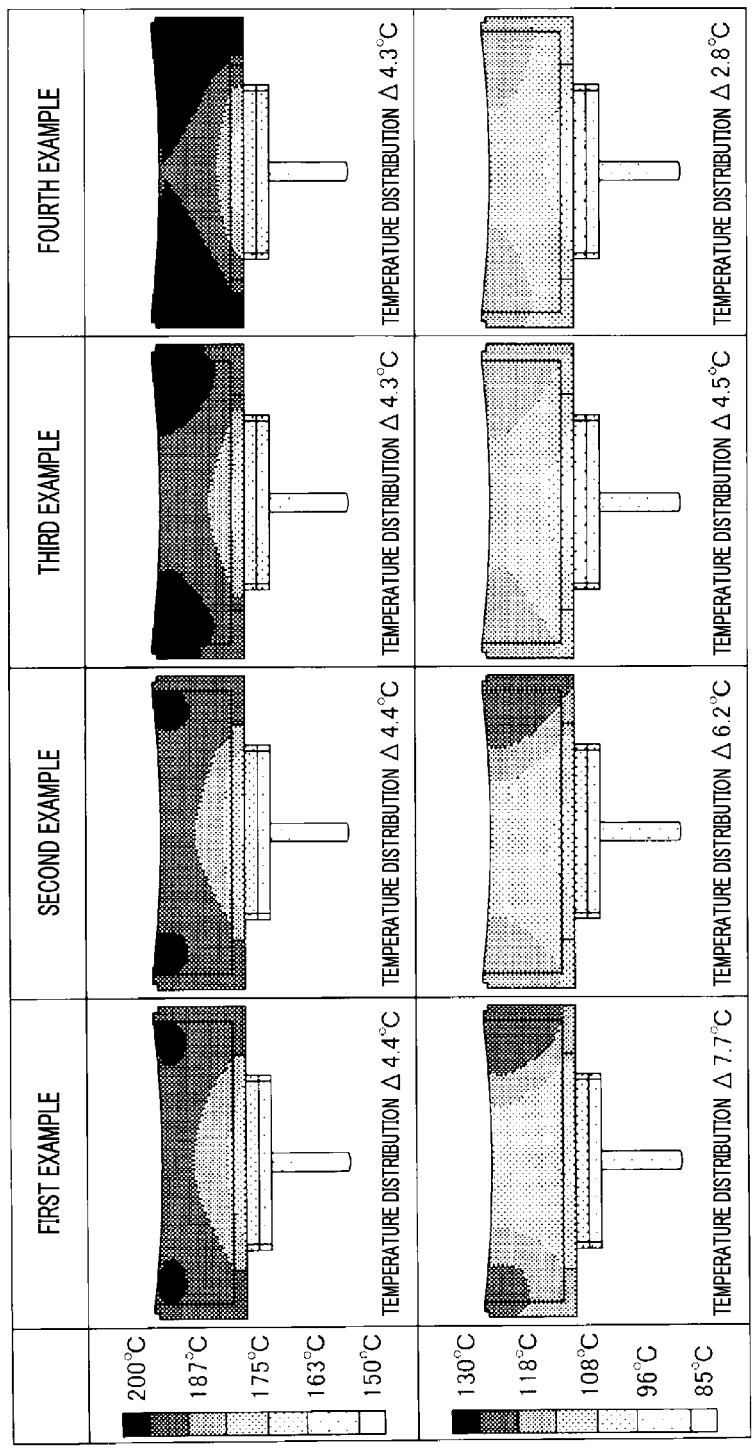
FIG. 8 is a diagram illustrating an example of a simulation result for temperature distributions in the valve bodies of the first to fourth examples.

Simulations are conducted for the valve bodies 76v1 to 76v4 of the first to fourth examples. FIG. 8 is a diagram showing examples of simulation results for temperature distributions in the valve bodies 76v1 to 76v4 of the first to fourth examples. FIG. 9 is a diagram illustrating examples of the simulation results for the temperatures of the valve body 76v and the flange 76f and the pressures at the inlet and the outlet of the flow path when the dry air flow rate (Air flow rate) is varied in the valve bodies 76v1 to 76v4 of the first to fourth examples. Here, the simulations are conducted on the assumption that the valve body 76v is heated by heat amount (120 W) generated from the heater 76h at a time of IDLE, whereas the valve body 76v is heated by heat amount (120 W) inputted from the plasma at a time of PROCESS.

Further, the upper row of FIG. 8 shows examples of the simulation results for the temperature distributions when the dry air is not supplied (0 L/min) at the time of PROCESS. The lower row of FIG. 8 shows examples of the simulations results for the temperature distributions when the dry air is supplied (20 L/min) at the time of PROCESS. Further, in FIG. 8, the temperature difference between the maximum temperature and the minimum temperature of the valve body 76v is also referred to as a temperature distribution Δ.

As can be seen from the comparison of the upper row and the lower row of FIG. 8, all of the valve bodies 76v1 to 76v4 of the first to fourth examples are cooled by supplying the dry air. Further, as can be seen from the upper row of FIG. 8, the temperature distributions Δ of the valve bodies 76v1 to 76v4 of the first to fourth examples are substantially same when the dry air is not supplied at the time of PROCESS. Further, as can be seen from the lower row of FIG. 8, the temperature distribution Δ of the valve body 76v4 of the fourth example becomes smaller than the temperature distributions Δ of the other valve bodies 76v1 to 76v3 when the dry air is supplied at the time of PROCESS.

An upper part of FIG. 9 shows temperatures (° C.) of the valve body 76v and the flange 76f when the dry air flow rate (Air flow rate) is varied to 0 L/min, 10 L/min, 20 L/min and 30 L/min at the time of IDLE of each of the valve bodies 76v1 to 76v4 of the first to fourth examples. A middle part of FIG. 9 shows temperatures (° C.) of the valve body 76v and the flange 76f when the dry air flow rate (Air flow rate) is varied to 0 L/min, 10 L/min, 20 L/min and 30 L/min at the time of PROCESS of each of the valve bodies 76v1 to 76v4 of the first to fourth examples. A lower part of FIG. 9 shows pressures (MPa) at the inlet (INLET) and the outlet (OUTLET) of the flow path and a pressure loss as a pressure difference therebetween when the dry air flow rate (Air flow rate) is varied to 10 L/min, 20 L/min and 30 L/min in each of the valve bodies 76v1 to 76v4 of the first to fourth examples. Regarding the pressure loss, when the pressure difference between the inlet and the outlet is sufficiently small, it is indicated by [−].

As can be seen from the upper part and the middle part of FIG. 9, all of the valve bodies 76v1 to 76v4 of the first to fourth examples have same cooling capabilities. Further, as can be seen from the lower part of FIG. 9, the pressure loss is several Pa, which is sufficiently small.

So far, the exemplary embodiment of the substrate processing apparatus has been described. However, the present disclosure is not limited to the above-described exemplary embodiment, and various changes and modifications may be made within the scope of the claims.

Further, the plasma processing apparatus according to the present exemplary embodiment may be applicable to any of various types such as an atomic layer deposition (ALD) apparatus, capacitively coupled plasma (CCP), inductively coupled plasma (ICP), radial line slot antenna, electron cyclotron resonance plasma (ECR) and helicon wave plasma (HWP). Further, the plasma processing apparatus has been described as the substrate processing apparatus. However, the substrate processing apparatus is not limited to the plasma processing apparatus as long as it is configured to perform a required processing (for example, a film forming processing, an etching processing, etc.) on a substrate. By way of example, the substrate processing apparatus may be a CVD apparatus.

In the present specification, the wafer (semiconductor wafer) W is described as an example of the substrate. However, the substrate is not limited thereto, and various kinds of substrates or photomasks for use in a LCD (Liquid Crystal display) or a FPD (Flat Panel Display), a CD substrate, and a print substrate may be used.

Further, the valve body 76v may be further equipped with a heat exchange accelerating member (not shown) to increase a contact area of the temperature-controlled fluid flowing in the flow path 76r. By way of example, the heat exchange accelerating member may be configured as a protrusions projecting toward the inside of the flow path 76r from the inner wall surface of the valve body 76v. That is, the heat exchange accelerating member is disposed to impede a flow of the temperature-controlled fluid flowing in the flow path 76r. The heat exchange accelerating member increases the contact area between the valve body 76v and the temperature-controlled fluid flowing in the flow path 76r, and is thus capable of accelerating the heat exchange between the valve body 76v and the temperature-controlled fluid.

Moreover, the valve body 76v is equipped with a casing member having an internal space; and a partition member configured to form the flow path 76r in the internal space of the casing member. By way of example, in the valve body 76v1 of the first example shown in FIG. 4A, the valve main body 111 and the base 112a of the flow path forming member 112 form the casing member having the recess 111a as the internal space, and the arc-shaped plate member 112b of the flow path forming member 112 serves as the partition member. This is the same in the valve body 76v2 of the second example shown in FIG. 4C. As another example, in the valve body 76v3 of the third example shown in FIG. 5A, the valve main body 131 and the cover member 132 form the casing member, and a portion of the depressed portion 131b where no groove 131c is formed serves as the partition member. This is the same in the valve body 76v4 of the fourth example shown in FIG. 5C.

In addition, the heat exchange accelerating member provided in the flow path 76r may be configured to support the casing member from the inside thereof. Accordingly, strength or rigidity of the valve body 76v having a hollow structure can be achieved. The heat exchange accelerating member may have, for example, a mesh-shaped or column-shaped structure, or may have a lattice structure. However, the shape and the layout of the heat exchange accelerating member are not limited thereto.

Besides, the heat exchange accelerating member may be formed as one body with at least one of the casing member and the partition member. By way of example, in the valve body 76v1 of the first example shown in FIG. 4A, the heat exchange accelerating member may be formed as one body with the arc-shaped plate member 112b serving as the partition member. Further, the heat exchange accelerating member may be formed at the inner wall surface of the recess 111a as one body with the valve main body 111 serving as the casing member. This is the same in the valve body 76v2 of the second example shown in FIG. 4C. As another example, in the valve body 76v3 of the third example shown in FIG. 5A, the heat exchange accelerating member may be formed as one body with the valve main body 131 which serves as the casing member and the partition member. Further, the heat exchange accelerating member may be formed as one body with the case member 132 which serves as the casing member. This is the same in the valve body 76v4 of the fourth example shown in FIG. 5C. With this configuration, the number of components required can be reduced. Furthermore, in the valve body 76v, the casing member, the partition member and the heat exchange accelerating member may be formed as a single body.

Moreover, the valve body 76v may be fabricated by using a 3D printer technology or an additive manufacturing technology. To elaborate, a lamination fabrication technology using a metal material may be used. For example, a fabrication technique of fabricating an object by sintering powder metal by irradiating a laser or an electronic beam thereto, a fabrication technique of fabricating an object by dissolving and depositing, while supplying a powder metal or a wire, the powder metal or the wire with a laser or an electronic beam, or the like may be employed. However, these fabrication techniques are nothing more than examples and are not limiting.

According to the exemplary embodiment, it is possible to provide the substrate processing apparatus having improved thermal responsiveness.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus, comprising:
    a chamber having an internal space, the chamber having an opening for transferring a substrate from and to the internal space; and
    a shutter configured to open and close the opening in the internal space, the shutter having a flow path for a temperature-controlled fluid, the flow path having:
        an inlet,
        a first supply path and a second supply path being branched from the inlet, the first and second supply paths extending upwards from the inlet while going back and forth in a horizontal direction, a first return path being connected with the first supply path and extending downwards from the first supply path while going back and forth in a horizontal direction,
a first outlet being connected with the first return path,
a second return path being connected with the second supply path and extending downwards from the second supply path while going back and forth in a horizontal direction, and
a second outlet being connected with the second return path.

2. The substrate processing apparatus of claim 1, wherein the first return path extends along the first supply path, the second return path extends along the second supply path.

3. The substrate processing apparatus of claim 1, wherein the shutter comprises:
a body having a first face; and
a cover member covering the first face,
wherein the first face and the cover member define the flow path.

4. The substrate processing apparatus of claim 3, wherein the flow path is defined by a groove formed on at least one of the first face or the cover member.

5. The substrate processing apparatus of claim 1, further comprising:
a fluid supply configured to supply the temperature-controlled fluid into the flow path;
a heater configured to heat the shutter; and
a control device,
wherein the control device controls the heater to control a temperature of the shutter.

6. The substrate processing apparatus of claim 5, further comprising:
an annular protection member defining the internal space,
wherein the control device is configured to control the temperature of the shutter to reduce a temperature difference between the annular protection member and the shutter.

7. The substrate processing apparatus of claim 1, wherein the shutter is fabricated by using a 3D printer technology or an additive manufacturing technology.

* * * * *